United States Patent [19]

Ingwall et al.

[11] Patent Number: 4,970,129
[45] Date of Patent: Nov. 13, 1990

[54] HOLOGRAMS

[75] Inventors: Richard T. Ingwall, Newton; Mark A. Troll, Somerville, both of Mass.

[73] Assignee: Polaroid Corporation, Cambridge, Mass.

[21] Appl. No.: 175,208

[22] Filed: Mar. 30, 1988

Related U.S. Application Data

[63] Continuation-in-part of Ser. No. 107,668, Oct. 9, 1987, abandoned, which is a continuation of Ser. No. 944,428, Dec. 19, 1986, abandoned.

[51] Int. Cl.$^5$ .................. G03H 1/02; G03C 5/16; G03C 1/73
[52] U.S. Cl. .................................. 430/1; 430/2; 430/290; 350/3.61; 350/3.6
[58] Field of Search ..................... 430/1, 2, 290; 350/3.61, 3.6

[56] References Cited

U.S. PATENT DOCUMENTS

| | | | |
|---|---|---|---|
| 3,601,017 | 8/1971 | Glatzer et al. | 430/1 |
| 3,672,744 | 6/1972 | Strope et al. | 430/1 |
| 3,776,727 | 12/1973 | Nassenstein et al. | 430/1 |
| 4,201,441 | 5/1980 | Matsumoto et al. | 430/1 |
| 4,509,817 | 4/1985 | Ho et al. | 430/2 X |
| 4,535,041 | 8/1985 | Fielding et al. | 430/1 |
| 4,588,664 | 5/1986 | Fielding et al. | 430/1 |
| 4,808,500 | 2/1989 | Wreede et al. | 430/2 X |

FOREIGN PATENT DOCUMENTS

| | | |
|---|---|---|
| 2113868 | 3/1983 | United Kingdom . |
| 81/01389 | 11/1981 | World Int. Prop. O. . |

OTHER PUBLICATIONS

Kogelnik et al., Applied Physics Letters, vol. 18, pp. 152-154, (Feb. 15, 1971).
Patent Abstracts of Japan, vol. 10, No. 132, (P-456) (2189), May 16, 1986.
B. D. Guenther and W. Hay, "Holographic Properties of DMP-128 Photopolymers", Ntis Technical Report AD-172.825, (1987).
Patent Abstracts of Japan, vol. 10, No. 53, (P-433) (2110), Mar. 4, 1986.
Patent Abstracts of Japan, vol. 10, No. 149, (P-461) (2206), May 30, 1986.
Patent Abstracts of Japan, vol. 9, No. 182, (P-376) (1905), Jul. 27, 1985.
A. Graube, "Holographic Optical Element Materials Research", DTIC Technical Report ADA062692, Particularly pp. 95-113, (1978).
J. R. Magarinos and D. J. Coleman, "Holographic Mirrors", Optical Engineering, vol. 24, pp. 769-780, (Sep.-/Oct. 1985).
Research Disclosure, No. 10804, "Image Forming Elements and Processing", (Apr. 1973), pp. 13-16.
B. J. Chang, "Dichromated Gelatin Holograms and their Applications", Optical Engineering, vol. 19, pp. 642-648, (Sep./Oct. 1980).
R. K. Curran and T. A. Shankoff, "The Mechanism of Hologram Formation in Dichromated Gelatin", Applied Optics, vol. 9, pp. 1651-1657, (Jul. 1970).

*Primary Examiner*—Cynthia Hamilton
*Attorney, Agent, or Firm*—Stanley H. Mervis

[57] ABSTRACT

Volume phase holograms and other holographic elements are disclosed which include microscopic areas of a material having an index of refraction different from that of the holographic fringes.

15 Claims, No Drawings

HOLOGRAMS

This application is a continuation-in-part of copending application Ser. No. 107,668 filed Oct. 9, 1987 (now abandoned) as a continuation of Ser. No. 944,428 filed Dec. 19, 1986 (now abandoned).

This invention is concerned with volume phase holograms and other holographic elements, and more particularly with the provision of volume phase holograms and other holographic elements characterized by having microscopic areas of a material having an index of refraction different from that of the holographic fringes. The novel holographic elements may exhibit increased diffraction efficiency and/or other desirable properties.

BACKGROUND OF THE INVENTION

Volume phase holograms, i.e., refractive index modulated holograms, are well known and have been prepared from a variety of photosensitive materials, particularly ones in which the holographic fringes are formed by photopolymerization or cross-linking.

Dichromated gelatin (DCG) has been widely used for the formation of volume phase holograms. The mechanism by which the holographic image is formed in DCG, however, is not settled, and several mechanisms have been proposed. One such proposal is that "cracks" or "voids" are formed between fringe planes in the gelatin, and that the resulting difference between the index of refraction of air (in the cracks or voids) and that of gelatin gives increased index modulation. (See A. Graube, "Holographic Optical Element Materials Research", U.S. Air Force Office of Scientific Research Technical Report 78-1626 (1978), available from the U.S. Defense Technical Information Center as DTIC Technical Report ADAO62692, particularly pages 95-113.) The presence of "voids" is disputed in an earlier article (R.K. Curran and T.A. Shankoff, "The Mechanism of Hologram Formation in Dichromated Gelatin", *Applied Optics*, July, 1970, Vol. 9, pp. 1651-1657; particularly p. 1655), which concludes that "cracks" provide an air-gelatin interface. A 1980 publication (B.J. Chang, "Dichromated Gelatin Holograms and Their Applications", *Optical Engineering*, Vol. 19, pp. 642-648 see particularly pp. 642-643) proposes yet another mechanism: a "molecular-chain spring" model. Yet another mechanism—an interaction between isopropanol and gelatin causing cracks when the isopropanol is removed—is proposed by J.R. Magarinos and D.J. Coleman, "Holographic Mirrors", *Optical Engineering*, 1985, Vol. 24, pp. 769-780. These researchers recognized that one way to support the hypothesis of the presence of voids (microvoids) would be to demonstrate the loss of holographic efficiency by replacing air in such voids with a liquid having an index of refraction matching that of gelatin, but they differed as to whether they achieved such a result. It is clear, however, that these researchers were investigating mechanisms rather than ways to modify the optical properties.

A particularly useful photopolymerizable composition to form volume phase holograms is described and claimed in U.S. Pat. No. 4,588,664 issued May 13, 1986 to Herbert L. Fielding and Richard T. Ingwall. These photopolymerizable compositions comprise a dye sensitizer such as methylene blue, a branched polyethylenimine as a polymerization initiator, and a free radical polymerizable ethylenic unsaturated monomer, e.g., an acrylic monomer, and preferably, lithium acrylate. A method of stabilizing holograms formed from this photopolymerizable composition is described and claimed in U.S. Pat. No. 4,535,041 issued to Herbert L. Fielding and Richard T. Ingwall on Aug. 13, 1985.

SUMMARY OF THE INVENTION

In accordance with the present invention, volume phase holograms and other holographic elements are provided which include, between the fringes, microscopic areas of a material having an index of refraction different from that of the holographic fringes.

DETAILED DESCRIPTION OF THE INVENTION

As is well known and understood in the holographic art, volume phase holograms record information as a modulation of the refractive index of the medium in which the recording is effected. Thus, the polymerization of a monomer present in a photopolymerizable film records the laser holographic exposure as a pattern of "fringes" or "strata" of polymer. The fringes are relatively parallel to the support in a volume phase reflection hologram, and relatively perpendicular to the support in a volume phase transmission hologram. The polymer comprising the fringes has a different index of refraction than the material present between the fringes, and the resulting modulation of light as a function of the index differences permits reconstruction of the hologram.

Examination by scanning electron microscopy of the microstructure of holograms formed using the photopolymerizable compositions described in the above-referenced U.S. Pat. No. 4,588,664 has revealed the presence of microvoids containing air positioned between the photopolymer fringes; the microvoids were generally spherical in cross-section. Although they appear isolated in the electron micrographs, the microvoids are interconnected. Alternating planes of solid and porous (connected microvoids) material appear in layers spaced according to the appropriate Bragg condition. The microvoids generally have a diameter on the order of about 50-80% of the distance between adjacent solid phases (fringes), and may have a diameter, for example, on the order of about half the wavelength of the light reflected by a holographic reflection optical element. These microvoids contain air and they vary in concentration as a function of the intensity of the exposure. It is believed that these microvoids result, at least in part, from the lateral diffusion of monomer within the film to areas where polymerization is occurring. Development and drying of the photopolymerized film removes unreacted monomer and water or other solvent for the monomer, and air fills the resulting microvoids. Since the air-filled microvoids have some light-scattering power, the holographic element may exhibit some haze as a function of the size of the microvoids.

It now has been found that it is possible to repeatedly and reversibly, or permanently, replace at least part of the air in the microvoids with another material without significantly changing the relative spacing of the holographic fringes. The added material preferably is permanently retained within the holographic element. Desirable changes in the optical properties/holographic performance may be effected in this manner, since small differences between the refractive index or optical density of the photopolymerized (fringe) areas and that of the added material are amplified in their effect on the optical properties of the combination. For convenience, the material replacing air in the microvoids may be referred to as the "microvoid material".

The material replacing the air in the microvoids is introduced by imbibing the desired material, or a solution thereof, into the holographic element, e.g., by dipping. The added material may be one capable of further reaction, e.g., a polymerizable monomer or a cross-linkable compound, and such further reaction is effective to permanently incorporate said material within the holographic element. Incorporation of a polymerizable monomer may be effected simultaneously with a polymerizable initiator, or more preferably the initiator may be introduced first followed by the polymerizable monomer. The selection of the initiator and of the monomer should avoid the introduction or formation of any undesirable coloration. Particularly useful monomers for the purpose of obtaining a lower index polymer in the microvoids are fluorinated, particularly perfluorinated monomers. Polymerization may be effected by any known method, e.g., ultraviolet initiation, thermal or electron beam, suitable for the monomer and compatible with the hologram matrix material. In certain instances, a thin film of the resulting polymer may also be formed on the surface of the hologram, and such a polymeric film may provide added physical protection, e.g., resistance to moisture or other environmental factors which otherwise would adversely affect the stability or optical properties of the hologram. In addition, such a surface polymeric film may be utilized to adhere or bond the hologram to another material or hologram.

The microvoid material may be a dye or other light-absorbing compound, thus providing absorption of light of a pre-determined wavelength or wavelength band. This embodiment is particularly useful in the provision of holographic notch filters, e.g., to provide eye protection against lasers, since the resulting optical density (transmission) will be a combination of the laser light reflected and the laser light absorbed. By suitable selection of the added light absorber, one may increase the optical density with respect to the wavelength(s) of concern while maintaining substantial transmission of other wavelengths, thus permitting increased protection for the user without undesirable or excessive loss of vision in, e.g., visible light.

The added material may provide a reduction in the haze level of the holographic element by virtue of the difference in index of refraction between it and the "fringe" polymer being less than the difference between the fringe polymer and air. While in some instances there may be a reduction in diffraction efficiency as a result, particularly if the hologram is a reflection hologram, the benefit of reduced haze may more than offset the reduction in diffraction efficiency. Indeed, if the added material has an index of refraction that nearly matches that of the fringe polymer in one region of the spectrum, e.g., the visible, but differs in another region, e.g., the infrared, one may essentially eliminate haze in the first region while obtaining strong reflectivity in the other region.

Selection of suitable materials to fill the microvoids may be done by selecting materials of the desired index, followed by routine testing to determine permeability of the hologram to the test material. It will be recognized that suitable combinations of microvoid material and of hologram matrix may differ as a function of changes in either component. In general, it is desirable to utilize a microvoid material which differs by at least 0.1 in its index of refraction (lower or higher) from that of the hologram matrix, with greater effects being obtained where the index difference is greater. By selecting microvoid materials and solvents which do not swell the matrix, or swell it very little, the spacing between fringes may be maintained substantially unchanged; conversely, one may increase the spacing between recorded fringe planes by selecting microvoid materials and solvents which swell the matrix.

Since the average refractive index of the microvoid filled film is higher than that of the film with air filled microvoids, the wavelength of maximum reflectivity for reflection holograms is shifted towards longer wavelengths, i.e., towards the red, accompanied by a reduction in diffraction efficiency. This property may be used to adjust the wavelength of maximum reflectivity in narrow band holographic filters, since it is possible to make predictive adjustments of the peak wavelength over a range of about 50–100 nm as a function of the index of refraction of the material selected to fill the microvoids.

In the case of transmission holograms, the peak angle of diffraction is shifted by the presence of the microvoid material. Since the efficiency of such gratings varies periodically with grating strength (which varies with exposure level), the microvoid material may either increase or lower the diffraction efficiency of the grating.

If the microvoid material has optical activity, i.e., it exhibits a different index of refraction for right- and left-circularly polarized light, the resulting hologram will exhibit different properties for light of the two polarizations. If, for example, the microvoid material in a reflection hologram has substantially the same refractive index for one polarization of light as the matrix, that type of circularly polarized light would be transmitted with little or no attenuation, while light of the opposite polarization would be strongly reflected.

It will be recognized that the physical size of the material incorporated in the microvoids must be small enough to enter into the microvoids, and that this size will vary with the size of the microvoids.

The microvoid material may be selected to increase the environmental stability of the hologram, e.g., to humidity and/or temperature, or to reduce or eliminate adverse effects as the result of contact with adhesives or plasticizers. (The stabilization treatment comprising sequential treatment with a zirconium salt and a fatty acid described in the above-mentioned U.S. Pat. No. 4,535,041 does not fill the microvoids, nor did the α-cyanoethyl acrylate glue used in Example 3 of the above-mentioned U.S. Pat. No. 3,588,664.)

For convenience, the disclosures of the above-mentioned U.S. Pat. Nos. 4,588,664 and 4,535,041 are hereby expressly incorporated herein.

The following examples are given for the purpose of illustration and are not intended to be limiting.

EXAMPLE 1

A transmission hologram was prepared using a photopolymerizable film of the type described in Example 7 of the above-mentioned U.S. Pat. No. 4,588,664, following the general procedure for development and stabilization described in said example using helium-neon laser light (633 nm). The final, post-processing dry thickness of the film (exclusive of the support) was about 6 microns. Analysis of the transmission spectrum of the dry hologram using a visible spectrophotometer showed a spectral bandwith of about 170 nm and a maximum diffraction efficiency of 83% at 565 nm.

When trifluoroethanol (refractive index 1.29) was imbibed into the dry hologram the spectral bandwith was reduced to about 60 nm, the maximum diffraction efficiency increased slightly to 87% and the wavelength of maximum efficiency was shifted to about 635 nm. The trifluoroethanol was washed out of the hologram with several applications of isopropanol and acetone, and the hologram dried. General Electric Silicone Oil SF 99 (refractive index 1.39) then was imbibed into the hologram; the diffraction efficiency was measured to be about 58% with the wavelength of maximum efficiency about 630 nm.

EXAMPLE 2

A small amount of a 1% solution of benzoin ethyl ether in xylene was placed on a transmission hologram prepared in the manner described in Example 1, and the xylene allowed to evaporate. A small quantity of a perfluoropolyether diacrylate

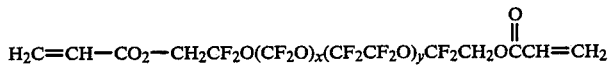

(molecular weight about 2100; refractive index 1.31) then was dropped on the holographic slide, allowed to spread over the holographic image area and then covered with a glass slide. The monomer impregnated hologram was exposed to ultraviolet light (405 nm) for 10 minutes, followed by a 10 minute exposure to 365 nm ultraviolet light. The cover glass was observed to be fixed in place after the first UV exposure. The diffraction efficiency after the second UV exposure was found to be about 20%, as compared with an initial efficiency of 74%. The cover glass was removed and the hologram boiled in water for about one and a half hours, after which the efficiency was found to be about 22%. The hologram was removed from its glass support as an intact but somewhat fragile free-standing film.

EXAMPLE 3

A mixture of a solution of diethoxyacetophenone dissolved in

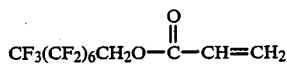

and of the perfluorinated monomer used in Example 2 was imbibed into a transmission hologram prepared in the manner described in Example 1 using a helium-neon laser exposure of 15 milliJoules/cm². The hologram then was exposed to ultraviolet light for 15 minutes. The diffraction efficiency of the treated hologram was found to be 70% as compared with the initial diffraction efficiency of 22%.

EXAMPLE 4

The procedure described in Example 2 was repeated using a reflection hologram exhibiting a diffraction efficiency greater than 99% at 490 nm and a twenty minute UV exposure. The diffraction efficiency of the resulting hologram containing the polymerized perfluorinated polymer in the microvoids was found to be 80% at 585 nm. After heating at 150° C. for about 15 hours, the diffraction efficiency of the treated reflection hologram was found to be 87% at 540 nm.

EXAMPLE 5

A holographic mirror (reflection hologram) in the center of a photopolymerizable layer on a glass support, made using a helium-neon laser and processed in the general manner described in Example 1, was treated with a solution of erythrosin in trifluoroethanol. After evaporation of the solvent, the photopolymerized layer was pink in color. The dye could not be removed by washing with isopropanol, methanol or mixtures of these alcohols with water. Spectrophotometric measurements of the optical density (transmission) were made at several angles of incidence. The dyed holographic mirror area exhibited a peak optical density greater than 5 for wavelengths between 530 and 555 nm at angles of incidence from 0° to 40°. By comparison, at normal incidence the original holographic mirror had a peak optical density of 2.8 at 580 nm, and the dyed non-holographic region had a peak optical density of 3.5 at 540 nm. The original holographic mirror was still visible by reflected light. Based upon these measurements, it was concluded that the erythrosin at least partially filled the microvoids.

The reflection holograms used in the above examples were exposed by directing collimated He:Ne light through the back (uncoated) side of the film plate held, by an index matching layer of xylene, in optical contact with a front surface mirror.

In the above examples, the microvoid materials had lower indices of refraction. As an example of a material having a higher index of refraction than the matrix and which has been used to fill the microvoids, mention may be made of bromo-naphthalene (refractive index 1.66).

It will be understood that other binders and polymers capable of providing volume phase holograms may be used in place of that used in the above example, provided that suitable microvoid materials may be imbibed into the hologram.

It will be understood that the holograms of this invention may be incorporated into other optical structures by the use of suitable adhesives, e.g., optical epoxy adhesives. In addition, the holograms may be potted or only the edges sealed to increase environmental stability.

While the invention has been described in detail and with reference to specific embodiments thereof, it will be apparent to those skilled in the art that various changes can be made without departing from the spirit and scope of the invention.

What is claimed is:

1. A volume phase holographic element formed by holographic exposure of a photopolymerizable element, characterized in that microvoids between fringes are at least partially filled with a material other than air, said material having a refractive index different from that of the matrix.

2. A volume phase holographic element as defined in claim 1 wherein said refractive index is lower than that of the matrix.

3. A volume phase holographic element as defined in claim 1 wherein said refractive index is higher than that of the matrix.

4. A volume phase holographic element characterized in that microvoids between fringes are at least partially filled with a material other than air, said material having a refractive index different from that of the matrix, said matrix comprising branched polyethylenimine and a polymerized ethylenic monomer.

5. A volume phase holographic element as defined in claim 4 wherein said monomer is an acrylic acid.

6. A volume phase holographic element as defined in claim 1 wherein said material is hydrophobic.

7. A volume phase holographic element characterized in that microvoids between fringes are at least partially filled with a material other than air, said material having a refractive index lower than that of the matrix, said material having a lower index of refraction is a polymerized fluorinated monomer.

8. A volume phase holographic element as defined in claim 7 wherein a thin layer of said polymerized fluorinated monomer is present on the surface of said holographic element.

9. A volume phase holographic element characterized in that microvoids between fringes are at least partially filled with a material other than air, said material having a refractive index different from that of the matrix, wherein said material is a material capable of absorbing light of a wavelength reflected by said holographic element.

10. The method of forming a holographic element comprising effecting a holographic exposure of a photosensitive element to laser light, developing said exposed photosensitive element to provide a volume phase holographic element having microvoids between the fringes, and at least partially filling said microvoids with a material having a different index of refraction than that of the matrix material of said holographic element, said photosensitive element being a photopolymerizable element.

11. The method of forming a holographic element comprising effecting a holographic exposure of a photosensitive element to laser light, developing said exposed photosensitive element to provide a volume phase holographic element having microvoids between the fringes, and at least partially filling said microvoids with a material having a different index of refraction than that of the matrix material of said holographic element, said photosensitive element being a photopolymerizable element comprising a dye sensitizer, branched polyethylenimine, and a free radical polymerizable ethylenic unsaturated monomer.

12. The method of forming a holographic element comprising effecting a holographic exposure of a photosensitive element to laser light, developing said exposed photosensitive element to provide a volume phase holographic element having microvoids between the fringes, and at least partially filling said microvoids by introducing a polymerizable monomer into said microvoids, and then polymerizing said monomer to provide in said microvoids a material having a lower index of refraction than said matrix.

13. The method as defined in claim 12 wherein said monomer is a fluorinated monomer.

14. The method as defined in claim 12, including the step of polymerizing a thin layer of said monomer on the surface of said holographic element.

15. A volume phase holographic element characterized in that microvoids between fringes are at least partially filled with a polymer formed by introducing a monomer into said microvoids and polymerizing said monomer in said microvoids, said polymer having a refractive index different from that of the matrix.

* * * * *